United States Patent [19]

Needham et al.

[11] 3,940,547
[45] Feb. 24, 1976

[54] ADHESIVE POLYOLEFIN COMPOSITION

[75] Inventors: Donald G. Needham; Ray D. Griffin, both of Bartlesville, Okla.

[73] Assignee: Phillips Petroleum Company, Bartlesville, Okla.

[22] Filed: Nov. 2, 1973

[21] Appl. No.: 412,282

[52] U.S. Cl. .............. 428/463; 156/306; 156/331; 156/334; 260/94.9 R; 428/461; 428/474; 428/483; 428/494; 428/500; 428/522
[51] Int. Cl.² B32B 15/08; B32B 27/06; B32B 27/30
[58] Field of Search .......... 161/188, 191, 216, 403; 117/136, 137; 156/334, 306, 331; 260/94.9 R; 428/420, 191, 461, 920, 921

[56] References Cited
UNITED STATES PATENTS

| | | | |
|---|---|---|---|
| 2,671,080 | 3/1954 | McCormack | 117/136 X |
| 3,131,115 | 4/1964 | Robitschek et al. | 161/191 |
| 3,143,364 | 8/1964 | Klein | 161/216 X |
| 3,322,612 | 5/1967 | Burd | 117/137 X |
| 3,345,247 | 10/1967 | Mahar et al. | 161/188 X |
| 3,449,192 | 6/1969 | Hook | 161/216 X |
| 3,481,812 | 12/1969 | Holub et al. | 161/216 X |
| 3,821,022 | 6/1974 | Rees et al. | 117/136 X |

*Primary Examiner*—George F. Lesmes
*Assistant Examiner*—Alan T. McDonald

[57] ABSTRACT

Combination of a polyolefin; a crosslinking agent; a halogenated phosphorous-nitrogen compound having the formula

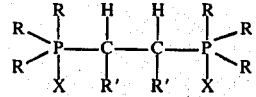

where R′ is selected from the group consisting of hydrogen and alkyl radicals having 1 to 3 carbon atoms, R is a cyano alkyl radical having 2 to 6 carbon atoms and X is chlorine, bromine, or iodine; ammonium polyphosphate; and hexachlorocyclopentadiene dimer yields a composition which is strong, fire-retardant and also strongly adherent to certain surfaces including aluminum.

28 Claims, No Drawings

ADHESIVE POLYOLEFIN COMPOSITION

This invention relates to the bonding of polymers to other materials. In another aspect it relates to the use of fire-retardant additives to increase the bonding strength of polymers. In still another aspect it relates to the use of adhesive polymers to form laminates. In yet another aspect it relates to fire-retardant coatings.

Various flame-retardant additives have been used in the past to reduce the flammability rating of polymers or polymeric systems. During the course of experiments to develop fire-retardant polymers, it has been unexpectedly discovered that combining certain fire-retardant additives and a cross-linking agent with a polyolefin yields a polymeric product which has a significant improvement in useful adhesive qualities. In addition to forming a strong bond with polyamides, polyesters, other polyolefins, rubbers, and similar polymeric compositions, the improved composition is particularly adherent to aluminum. The composition is, therefore, useful as a fire-resistant coating for any of those materials to which it adheres and is also a good adhesive for use in forming laminates of such materials.

Accordingly, an object of this invention is to provide an improved polymer having both a high resistance to fire and good adhesive characteristics. A further object is to provide a process for bonding a fire-resistant polymer to aluminum. Still another object is to provide a useful combination of a fire-resistant polymer bonded to another material. Yet another object is to provide laminates using a fire-resistant polymer as a bonding material. Another object is to provide fire-retardant coatings for a variety of materials.

In accordance with the invention, a normally solid, thermoplastic polyolefin is combined with a crosslinking agent, a halogenated phosphorus-nitrogen compound, ammonium polyphosphate, and a hexachlorocyclopentadiene dimer. The resulting composition is both strong and fire resistant and is capable of forming a strong bond with certain other materials.

Although the use of any polyolefin is considered to be within the scope of this invention, the preferred polyolefin is polyethylene, more particularly an ethylene homopolymer, a copolymer of ethylene and at least one acyclic straight or branch chain mono-1-olefin hydrocarbon having 3 to 8 carbon atoms per molecule, or mixtures of such homopolymers, of such copolymers, or of at least one such homopolymer and at least one such copolymer. A presently preferred group of such hydrocarbon comonomers are the straight chain 1-olefin hydrocarbons, particularly those straight chain 1-olefin hydrocarbons having 3 to 6 carbon atoms per molecule. The copolymers are usually formed with ethylene constituting at least 75 weight percent of the total monomers. Specific copolymers of ethylene include, for example, copolymers of ethylene and 1-butene, copolymers of ethylene and propylene, copolymers of ethylene and isobutene, copolymers of ethylene and 1-pentene, copolymers of ethylene and 3-methyl-1-butene, copolymers of ethylene and 1-hexene, copolymers of ethylene and 4-methyl-1-pentene, copolymers of ethylene and 1-heptene, copolymers of ethylene and 1-octene, copolymers of ethylene and 4-ethyl-1-hexene, and blends thereof.

In general, the polymer of ethylene employed will have a melt index of at least about 10, based on ASTM D1238–70, Condition E, a density in the range of about 0.92 to about 0.97, based on ASTM D–1505–68, preferably in the range of about 0.940 to about 0.965. The polymer used will generally have a melt index in the range of about 10 to about 200, with polymers having a melt index in the range of about 10 to about 50 being presently preferred. The polymers can be produced by any suitable method and can be selected from among those commercially available where desired.

Crosslinking compounds which are considered to be suitable are the acetylenic diperoxy compounds, which includes the hexynes having the formula

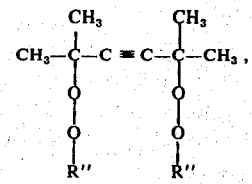

octynes having the formula

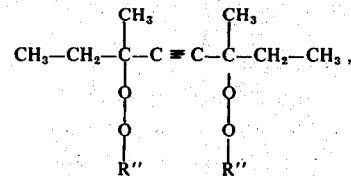

and octadiynes having the formula

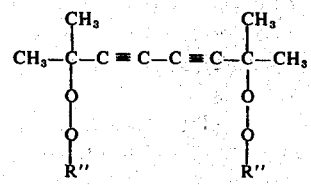

wherein R" is selected from the group consisting of tertiary alkyl, alkoxycarbonyl, and benzoyl. In general, the molecular weight of the diperoxy compounds will fall within the range of about 230 to about 500. Excellent results are received with the above-noted hexynes. Among the compounds encompassed within the above-noted hexynes, octynes, and octadiynes are:

2,7-dimethyl-2,7-di(t-butylperoxy)octadiyne-3,5;
2,7-dimethyl-2,7-di(peroxy ethyl carbonate)octadiyne-3,5;
3,6-dimethyl-3,6-di(peroxy ethyl carbonate)octyne-4;
3,6-dimethyl-3,6(t-butylperoxy)octyne-4;
2,5-dimethyl-2,5-di(peroxybenzoate)hexyne-3;
2,5-dimethyl-2,5-di(peroxy-n-propyl carbonate)hexyne-3;
2,5-dimethyl-2,5-di(peroxy isobutyl carbonate)hexyne-3;
2,5-dimethyl-2,5-di(peroxy ethyl carbonate)hexyne-3;
2,5-dimethyl-2,5-di(alpha-cumyl peroxy)hexyne-3;
2,5-dimethyl-2,5-di(peroxy beta-chloroethyl carbonate)hexyne-3;
2,5-dimethyl-2,5-di(t-butylperoxy)hexyne-3.

A preferred crosslinking agent for use in the present invention is 2,5-dimethyl-2,5-di(t-butylperoxy)-hexyne-3. In general, the amount of the crosslinking agent will be in the range of about 0.1 to about 10, preferably in the range of about 0.5 to about 3, parts by weight per 100 parts by weight of the polymer of ethylene.

The halogenated phosphorus-nitrogen compound employed is represented by the formula

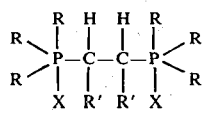

where R' is H or an alkyl radical having from 1 to 3 carbon atoms, R is a cyano alkyl radical having from 2 to 6 carbon atoms, and X is Cl, Br, or I. Specific examples of compounds considered to be suitable include propylene 1,2-bis[tris(2-cyano-butyl)phosphonium chloride], 2,3-butylene-bis[tris(cyano-propyl)phosphonium iodide], and the presently preferred ethylene 1,2-bis[tris(2-cyano-ethyl)phosphonium bromide]. The concentration of this component can be within the range of about 2.0 to about 7.5 percent by weight based on the polyolefin with a value in the range of about 2.5 weight percent to about 5 weight percent preferred.

The ammonium polyphosphate additive can be produced by the reaction of ammonia and phosphoric acid, with at least 45 percen of the resulting phosphate being in the form of polyphosphates, i.e., a mixture of dimers, trimers, and tetramers of phosphoric acid. The concentration of ammonium polyphosphate can be within the range of about 2 percent to about 7.5 percent by weight based on the weight of polyolefin, with a range of about 2.5 weight percent to about 5 weight percent being preferred.

The dimer of hexachlorocyclopentadiene ($C_{10}Cl_{12}$) employed in the invention is characterized by a melting point of 485°C., a refractive index (20°C.) of 1.627, and a density of 2.02 g/cc. The concentration of this component can be within the range of about 5 percent to about 20 percent by weight based on the weight of polyolefin with a range of about 7 weight percent to about 14 weight percent being preferred.

The polyolefin base, crosslinking agent, and other ingredients can be combined by any method to form a mixture of substantially uniform composition. Blending by means of tumble mixing, pelletizing the components of the composition, or a combination of these procedures are considered to be satisfactory means of mixing the ingredients. A preferred method is to tumble mix a pelletized combination of polyolefin and crosslinking agent with other components.

The mixed polyolefin composition can be bonded or laminated to a desired surface using any technique suitable for bonding a polyolefin to another material. Compression molding has been found to work well when laminating a polyolefin to a thin material such as metal foil. Suitable bonding conditions include a pressure within the range of 0 psi to about 1000 psi or above and a temperature within the range of about 350°F. to about 500°F. for a period of time suitable to permit a crosslinking reaction to take place within the polyolefin composition, usually within the range of about 4 to about 10 minutes. The preferred conditions for laminating a polyethylene composition with aluminum foil of approximately 5 mil thickness are a pressure of about 600 psi and a temperature of about 400°F. for a period of about 5 minutes.

Bonded products and laminates manufactured in accordance with the invention using suitable substrates have strongly adherent bonds, as fire retardant and, in some cases, fire resistant, and have the high strength and stress crack resistance of the crosslinked polyethylene used as a base for the composition. Uses of laminates so formed, for example, include, but are not limited to, metal surfaced boards for printed circuits, etch plates, heat shields, and other similar items. Because the polyolefin composition acquires adhesive properties and flame-retardant qualities without giving up the aesthetic appearance, strength and electrical insulating properties of the crosslinked polyolefin, the new composition lends itself to hundreds of uses which would otherwise require the use of a separate adhesive to bond the polyolefin to another surface.

The composition is also considered to be useful in bonding with many other normally solid organic thermoplastic materials, including polyamides such as nylon 6-6 and nylon 6, polyesters such as polyethylene terephthalate, other uncrosslinked polyolefins such as polypropylene, natural rubber and synthetic rubbers such as acrylonitrile-butadiene-styrene terpolymers, ethylene, propylene, diene terpolymers, and butadiene-styrene copolymers. In addition to bonding a polyolefin composition to these and other substances, formation of laminates using various substrates or combinations of substrates bonded with the composition of the invention and coating of suitable surfaces are considered to be within the scope of the invention. In a preferred embodiment, polyethylene in combination with a crosslinking agent and fire-retardant compounds is bonded to aluminum.

It has been found that an improved polyethylene composition which bonds well with aluminum dows not show improved adherence to copper. A composition which bonds well with aluminum has in fact been shown to bond less readily to copper than crosslinked polyolefin without additives.

EXAMPLE I

An ethylene homopolymer having a density of 0.965 and a melt index of 30; 2,5-dimethyl-2,5-di(t-butyl-peroxy)-hexyne-3; ethylene-bis[tris(2-cyanoethyl)-phosphonium bromide]; ammonium polyphosphate with 45% of the phosphates being in the form of polyphosphates; and hexachlorocyclopentadiene dimer were admixed in various proportions. Each of the resulting blends was applied in powder form to a substrate of 5 mil aluminum foil strip 1 inch wide which had been cleaned by wiping with acetone and air dried. The cleaned aluminum and polyethylene mixture were compression molded at a pressure of 600 psi at 400°F. for 5 minutes. Control runs were made using ethylene homopolymer alone and using only the ethylene homopolymer-crosslinking agent combination. The strength of the bond formed with aluminum for the various combinations is shown in the following table:

TABLE I

| Run No. | Additive Concentration as Percentage by Weight of Polyethylene | | | | Peel Strength lbs. |
|---|---|---|---|---|---|
| | 2,5-dimethyl-2,5-di(t-butylperoxy)-hexyne-3 | Ethylene bis-[tris(2-cyano-ethyl)phosphonium bromide] | Ammonium poly-phosphate | Hexachloro cyclopenta-diene Dimer | |
| 1 | 0 | 0 | 0 | 0 | 2.1 |
| 2 | 0 | 0 | 0 | 14 | 1.7 |
| 3 | 0 | 5 | 5 | 0 | 4.0 |
| 4 | 0 | 5 | 5 | 14 | 1.0 |
| 5 | 0.75 | 0 | 0 | 0 | 5.3 |
| 6 | 0.75 | 0 | 0 | 7 | 7.9 |
| 7 | 0.75 | 2.5 | 2.5 | 0 | 3.5 |
| 8 | 0.75 | 0 | 0 | 14 | 4.7 |
| 9 | 0.75 | 5 | 5 | 0 | 6.5 |
| 10 | 0.75 | 2.5 | 2.5 | 7 | 13.3* |
| 11 | 0.75 | 5 | 5 | 14 | 13.3* |

*Bonding strength was sufficient to cause the foil to tear or break at 13.3 lbs. peel strength instead of pulling away from the polymeric composition.

As shown by the table, maximum usable bonding strength was obtained using fairly low concentrations of fire-retardant additives, and increasing these concentrations to obtain increased fire resistance did not adversely affect the usable bonding strength. Separate testing of the polymeric composition with the composition of Run 11 from Table I showed the composition to be self-extinguishing in air.

EXAMPLE II

The procedure of Example I was used to test bonding strength for copper using copper foil 6 mils thick which had been cleaned by wiping with acetone and air dried. The results of this procedure are shown in Table II:

TABLE II

| Run No. | Additive Concentration as Percentage by Weight of Polyolefin | | | | Peel Strength lbs. |
|---|---|---|---|---|---|
| | 2,5-dimethyl-2,5-di(t-butylperoxy)-hexyne-3 | Ethylene bis-[tris(2-cyano-ethyl)phosphonium bromide] | Ammonium poly-phosphate | Hexachloro-cyclopenta-diene Dimer | |
| 12 | 0.75 | 0 | 0 | 0 | 5.1 |
| 13 | 0.75 | 0 | 0 | 14 | 4.7 |
| 14 | 0.75 | 5 | 5 | 0 | 1.1 |
| 15 | 0.75 | 2.5 | 2.5 | 7 | 3.2 |
| 16 | 0.75 | 5 | 5 | 14 | 3.2 |

As shown by Table II, bonding strength with copper was not improved by addition of flame-retardant materials. This further points out the unique and unexpected nature of the bonding strength with aluminum.

Reasonable variations and modifications are possible within the scope of the foregoing disclosure and the appended claims to the invention.

We claim:

1. A laminate comprising a first layer of a first material selected from the group consisting of suitable metals, elastomers, resins, and combinations thereof and a second layer bonded to said first layer, said second layer being formed of a composition comprising a polyolefin, an acetylenic diperoxy crosslinking agent, a halogenated phosphorus-nitrogen compound represented by the formula

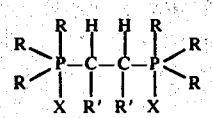

where R' is selected from the group consisting of hydrogen and alkyl radicals having 1 to 3 carbon atoms, R is a cyano alkyl radical having 2 to 6 carbon atoms, and X is chlorine, bromine, or iodine; ammonium polyphosphate having at least 45 percent of phosphate in the form of polyphosphates; and dimer of hexachlorocyclopentadiene; said first material being a material to which said composition of said second layer will adhere.

2. A laminate in accordance with claim 1 wherein said first material is selected from the group consisting of aluminum, polyamides, polyesters, polyolefins, synthetic rubber, natural rubber, and combinations thereof.

3. A laminate in accordance with claim 2 additionally comprising a third layer of a material selected from the group consisting of suitable metals, elastomers, resins, and combinations thereof bonded to said second layer.

4. A laminate in accordance with claim 3 wherein said third layer comprises aluminum.

5. A laminate in accordance with claim 3 wherein said third layer comprises material selected from the group consisting of aluminum, polyamides, polyesters, polyolefins, synthetic rubber, natural rubber, and combinations thereof.

6. A laminate comprising a first layer of aluminum and a second layer bonded to said first layer, said second layer being formed of a composition comprising:
   a polyolefin;
   an acetylenic diperoxy crosslinking agent;
   from about 2 percent to about 7.5 percent by weight based on the weight of said polyolefin of ammonium polyphosphate having at least 45 percent of phosphate in the form of polyphosphates;
   from about 5 percent to about 20 percent by weight based on the weight of said polyolefin of a dimer of hexachlorocyclopentadiene; and from about 2 percent to about 7.5 percent by weight based on the weight of said polyolefin of a halogenated phosphorus-nitrogen compound represented by the formula

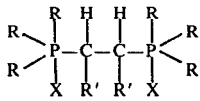

where R' is selected from the group consisting of hydrogen and alkyl radicals having 1 to 3 carbon atoms, R is a cyano alkyl radical having 2 to 6 carbon atoms, and X is chlorine, bromine, or iodine.

7. A laminate in accordance with claim 6 additionally comprising a third layer of a material selected from the group consisting of suitable metals, elastomers, resins, and combinations thereof bonded to said second layer.

8. A laminate in accordance with claim 7 wherein said third layer is selected from the group consisting of aluminum, polyamides, polyesters, polyolefins, synthetic rubber, natural rubber, and combinations thereof.

9. A laminate in accordance with claim 8 wherein said third layer comprises aluminum.

10. The process of bonding a suitable first surface to a suitable second surface, said process comprising combining a polyolefin, an acetylenic diperoxy crosslinking agent, ammonium polyphosphate having at least 45 percent of phosphate in the form of polyphosphates, dimer of hexachlorocyclopentadiene, and a halogenated phosphorus-nitrogen compound represented by the formula

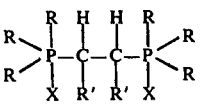

where R' is selected from the group consisting of hydrogen and alkyl radicals having 1 to 3 carbon atoms, R is a cyano alkyl radical having 2 to 6 carbon atoms, and X is chlorine, bromine, or iodine; depositing the thus-prepared polyolefin composition between said suitable first surface to which it is capable of adhering and said suitable second surface to which it is capable of adhering; heating said polyolefin composition, said first surface, and said second surface to a temperature above the melting point of said polyolefin composition; maintaining said polyolefin composition, said first surface, and said second surface at said temperature for a period of time sufficient to permit a crosslinking reaction to take place; and cooling said polyolefin, said first surface, and said second surface.

11. A process in accordance with claim 10 wherein said first surface is selected from the group consisting of aluminum, polyamides, polyesters, polyolefins, synthetic rubber, natural rubber, and combinations thereof and wherein said second surface is selected from the group consisting of aluminum, polyamides, polyesters, polyolefins, synthetic rubber, natural rubber, and combinations thereof.

12. A process in accordance with claim 10 wherein said first surface comprises aluminum.

13. A process in accordance with claim 12 wherein said second surface comprises aluminum.

14. A process in accordance with claim 12 wherein said second surface comprises a polymeric material.

15. A process of bonding a polyolefin to a surface of a suitable material, said process comprising combining with polyolefin, an acetylenic diperoxy crosslinking agent, ammonium polyphosphate having at least 45 percent of phosphate in the form of polyphosphates, dimer of hexachlorocyclopentadiene, and a halogenated phosphorus-nitrogen compound represented by the formula

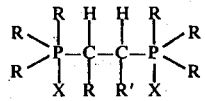

where R' is selected from the group consisting of hydrogen and alkyl radicals having 1 to 3 carbon atoms, R is a cyano alkyl radical having 2 to 6 carbon atoms, and X is chlorine, bromine, or iodine; mixing the combined ingredients to form a substantially uniform composition; contacting the thus-prepared polyolefin composition and said surface with the temperature of said polyolefin composition being above the melting point of said polyolefin composition; maintaining said polyolefin composition and said surface above said melting point for a period of time sufficient to permit a crosslinking reaction to take place; and then cooling said polyolefin composition below said melting point.

16. A process in accordance with claim 15 wherein said polyolefin is a polymer of ethylene having a density in the range of about 0.92 to about 0.97 and wherein said crosslinking agent comprises about 0.1 to about 10 percent by weight of said polymer of ethylene.

17. A process in accordance with claim 16 wherein said crosslinking agent is selected from the group consisting of hexynes having the formula

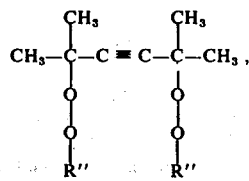

octynes having the formula

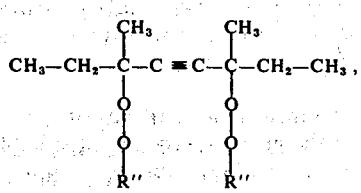

and octadiynes having the formula

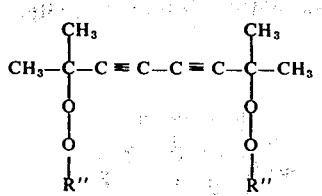

wherein R'' is selected from the group consisting of tertiary alkyl, alkoxycarbonyl, and benzoyl.

18. A process in accordance with claim 17 wherein the concentrations of each of said halogenated phosphorus-nitrogen compound and ammonium polyphosphate are in the range of from about 2 percent to about 7.5 percent by weight based on the weight of said high density polyethylene, and wherein the concentration of dimer of hexachlorocyclopentadiene is within the range of from about 5 percent to about 20 percent by weight based on the weight of said high density polyethylene.

19. A process in accordance with claim 18 wherein said halogenated phosphorus-nitrogen compound is ethylene bis[tris(2-cyanoethyl)phosphonium bromide].

20. A process in accordance with claim 19 wherein the material forming said surface is selected from the group consisting of aluminum, polyamides, polyesters, polyolefins, synthetic rubber, natural rubber, and combinations thereof.

21. A process of bonding a polyolefin to an aluminum surface, said process comprising:
combining with said polyolefin an acetylenic diperoxy crosslinking agent, from about 2 percent to about 7.5 percent by weight based on
the weight of said polyolefin of ammonium polyphosphate having at
least 45 percent of phosphate in the form of polyphosphates, from about 5 percent to about 20 percent by weight based on
the weight of said polyolefin of a dimer of hexachlorocyclopentadiene, and from about 2 percent to about 7.5 percent by weight based on
the weight of said polyolefin of a halogenated phosphorus-nitrogen compound represented by the formula

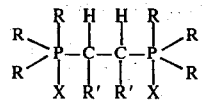

where R' is selected from the group consisting of hydrogen and alkyl radicals having 1 to 3 carbon atoms, R is a cyano alkyl radical having 2 to 6 carbon atoms, and X is chlorine, bromine, or iodine;
mixing the combined ingredients to form a substantially uniform composition;
contacting the thus-prepared polyolefin composition and said aluminum surface with the temperature of said polyolefin composition being above the melting point of said polyolefin composition;
maintaining said polyolefin composition and said aluminum surface above said melting point for a period of time sufficient to permit a crosslinking reaction to take place; and
subsequently cooling said polyolefin composition below said melting point.

22. A process in accordance with claim 21 wherein said polyolefin is a polymer of ethylene having a density in the range of from about 0.92 to about 0.97 and wherein said crosslinking agent comprises from about 0.1 to about 10 percent by weight of said polymer of ethylene.

23. A process in accordance with claim 22 wherein said crosslinking agent is selected from the group consisting of hexynes having the formula

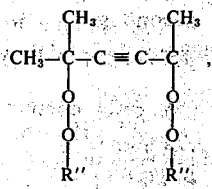

octynes having the formula

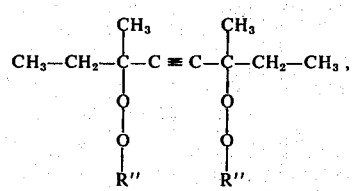

and octadiynes having the formula

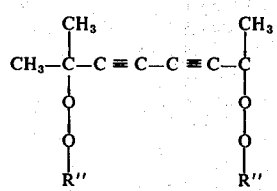

wherein R'' is selected from the group consisting of tertiary alkyl, alkoxycarbonyl, and benzoyl.

24. A process in accordance with claim 23 wherein said halogenated phosphorus-nitrogen compound is ethylene bis[tris(2-cyanoethyl)phosphonium bromide].

25. A process of bonding a first suitable surface to a second suitable surface, said process comprising:
combining
a polyolefin;
an acetylenic diperoxy crosslinking agent;
from about 2 percent to about 7.5 percent by weight based on the weight of said polyolefin of ammonium polyphosphate having at least 45 percent of phosphate in the form of polyphosphates;
from about 5 percent to about 20 percent by weight based on the weight of said polyolefin of a dimer of hexachlorocyclopentadiene; and
from about 2 percent to about 7.5 percent by weight based on the weight of said polyolefin of a halogenated phosphorus-nitrogen compound represented by the formula

where R' is selected from the group consisting of hydrogen and alkyl radicals having 1 to 3 carbon atoms, R is a cyano alkyl radical having 2 to 6 carbon atoms, and X is chlorine, bromine or iodine;

depositing the thus-prepared polyolefin composition between a first surface to which it is capable of adhering and a second surface to which it is capable of adhering;

heating said polyolefin composition, said first surface, and said second surface to a temperature above the melting point of said polyolefin composition;

maintaining said polyolefin composition, said first surface, and said second surface above said melting point for a period of time sufficient to permit cross-linking reaction to take place; and cooling said polyolefin, said first surface, and said second surface below said melting point.

26. A process in accordance with claim 25 wherein the material forming said first surface is selected from the group consisting of aluminum, polyamides, polyesters, polyolefins, synthetic rubber, natural rubber, and combinations thereof and wherein the material forming said second surface is selected from the group consisting of aluminum, polyamides, polyesters, polyolefins, synthetic rubber, natural rubber, and combinations thereof.

27. A process in accordance with claim 26 wherein the material forming said first surface is aluminum.

28. A process in accordance with claim 27 wherein the material forming said surface is aluminum.

* * * * *

UNITED STATES PATENT AND TRADEMARK OFFICE
CERTIFICATE OF CORRECTION

PATENT NO. : 3,940,547
DATED : February 24, 1976
INVENTOR(S) : Donald G. Needham and Ray D. Griffin It is certified that error appears in the above-identified patent and that said Letters Patent are hereby corrected as shown below:

Column 8, line 7, claim 15, change "with" to --- said ---
Column 12, line 13, claim 28, after "said" insert -- second --.

Signed and Sealed this

Tenth Day of May 1977

[SEAL]

Attest:

RUTH C. MASON
*Attesting Officer*

C. MARSHALL DANN
*Commissioner of Patents and Trademarks*